(12) United States Patent
Zhao et al.

(10) Patent No.: US 10,901,949 B2
(45) Date of Patent: Jan. 26, 2021

(54) METHOD AND APPARATUS FOR COMPRESSING METADATA IN A FILE SYSTEM

(71) Applicant: EMC IP Holding Company LLC, Hopkinton, MA (US)

(72) Inventors: Junping Frank Zhao, Beijing (CN); Accela Yilong Zhao, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 190 days.

(21) Appl. No.: 15/628,563

(22) Filed: Jun. 20, 2017

(65) Prior Publication Data
US 2018/0101542 A1 Apr. 12, 2018

(30) Foreign Application Priority Data
Jun. 21, 2016 (CN) .......................... 2016 1 0454287

(51) Int. Cl.
*G06F 3/06* (2006.01)
*G06F 16/174* (2019.01)
*G06F 16/13* (2019.01)
*H03M 7/30* (2006.01)

(52) U.S. Cl.
CPC .......... *G06F 16/1744* (2019.01); *G06F 3/064* (2013.01); *G06F 3/0608* (2013.01); *G06F 3/0643* (2013.01); *G06F 3/0673* (2013.01); *G06F 16/13* (2019.01); *H03M 7/3059* (2013.01); *H03M 7/3091* (2013.01); *H03M 7/707* (2013.01)

(58) Field of Classification Search
CPC .... G06F 16/1744; G06F 16/13; G06F 3/0608; G06F 3/064; G06F 3/0643; G06F 3/0673; H03M 7/3059; H03M 7/3091; H03M 7/707
See application file for complete search history.

(56) References Cited

U.S. PATENT DOCUMENTS

| | | | |
|---|---|---|---|
| 6,978,283 B1 * | 12/2005 | Edwards | G06F 3/0613 |
| 7,424,497 B1 * | 9/2008 | Leverett | G06F 16/188 |
| 7,496,586 B1 * | 2/2009 | Bonwick | H03M 7/30 |
| 8,086,585 B1 * | 12/2011 | Brashers | G06F 16/137 |
| | | | 707/705 |

(Continued)

OTHER PUBLICATIONS

Google Search (Year: 2015).*

*Primary Examiner* — Mark D Featherstone
*Assistant Examiner* — Kweku William Halm
(74) *Attorney, Agent, or Firm* — BainwoodHuang

(57) ABSTRACT

Embodiments of the present disclosure relate to a method and an apparatus for compressing metadata in a file system. The method comprises, in response to receiving a first request for writing first data to a file, determining whether the first request is for an initial write to a storage area associated with a second indirect block in the first group of indirect blocks, the first group of indirect blocks at least including a first indirect block and the second indirect block. The method further comprises, in response to the initial write, allocating a first group of data blocks for writing the first data on a storage device. In addition, the method further comprises compressing the first group of indirect blocks by encoding a first group of storage addresses corresponding to the first group of data blocks into the first indirect block.

14 Claims, 14 Drawing Sheets

(56) References Cited

U.S. PATENT DOCUMENTS

| | | | |
|---|---|---|---|
| 9,122,697 B1 | 9/2015 | Bono et al. | |
| 9,122,712 B1 | 9/2015 | Bono et al. | |
| 9,128,951 B1 * | 9/2015 | Agrawal | G06F 16/1752 |
| 9,779,023 B1 | 10/2017 | Armangau et al. | |
| 9,880,762 B1 | 1/2018 | Armangau et al. | |
| 9,985,649 B1 | 5/2018 | Bassov et al. | |
| 2007/0106851 A1 * | 5/2007 | Bonwick | G06F 11/1076 |
| | | | 711/154 |
| 2007/0208757 A1 * | 9/2007 | Kazar | G06F 16/1824 |
| 2009/0210576 A1 * | 8/2009 | Casper | G06F 13/124 |
| | | | 710/20 |
| 2009/0268903 A1 * | 10/2009 | Bojinov | G06F 3/0622 |
| | | | 380/45 |
| 2009/0300084 A1 * | 12/2009 | Whitehouse | G06F 12/0866 |
| 2011/0055261 A1 * | 3/2011 | Makkar | H04L 67/1097 |
| | | | 707/770 |
| 2014/0019706 A1 * | 1/2014 | Kanfi | G06F 16/122 |
| | | | 711/171 |
| 2017/0031940 A1 * | 2/2017 | Subramanian | G06F 16/13 |
| 2018/0101542 A1 | 4/2018 | Zhao et al. | |

* cited by examiner

METHOD AND APPARATUS FOR COMPRESSING METADATA IN A FILE SYSTEM

RELATED APPLICATIONS

This application claim priority from Chinese Patent Application Number CN201610454287.4, filed on Jun. 21, 2016 at the State Intellectual Property Office, China, titled "METHOD AND DEVICE FOR COMPRESSING METADATA FOR FILE SYSTEM" the contents of which is herein incorporated by reference in its entirety.

FIELD

Embodiments of the present disclosure generally relate to the field of data storage, and more particularly, to a method and an apparatus for compressing metadata in a file system.

BACKGROUND

Data in a file system may be divided into data and metadata. Data refers to actual data in a file, and metadata refers to information for describing attributes of data (such as storage location of the data). In an operating system like UNIX, file system metadata usually includes inodes, Indirect Blocks (hereinafter referred to as IBs for short), etc. IBs are the most important metadata, each of which is a pointer space allocated dynamically and pointing to a data block (i.e. a storage unit for storing data) of a file. IBs are organized in a hierarchy, where an IB at an upper level is used to store an address of an IB at a lower level, and an IB at the lowest level (i.e. a leaf IB) is used to store addresses of data blocks.

Apparently, keeping as many Indirect Blocks as possible in the memory is important to achieve better data access performance. However, conventional IBs are organized in a flat layout and ordered by their logical offsets, which will lead to waste of memory spaces. For example, assume that the size of each of the IBs is 8K bytes (B), the size of each of the data blocks is also 8 KB, and the address of each of the data blocks is 8 B, then leaf IBs corresponding to 1PB (Pebibyte, $1PB=2^{60}B$) data may need up to 1 TB (Tebibyte, $1 TB=2^{50}B$) memory space.

SUMMARY

Embodiments of the present disclosure provide a method and an apparatus for compressing metadata in a file system.

According to a first aspect of the present disclosure, there is provided a method for compressing metadata in a file system. The metadata comprises a first group of indirect blocks. The method comprises, in response to receiving a first request for writing first data to a file, determining whether the first request is for an initial write to a storage area associated with a second indirect block in the first group of indirect blocks, the first group of indirect blocks at least including a first indirect block and the second indirect block. The method further comprises, in response to the initial write, allocating a first group of data blocks for writing the first data on a storage device. In addition, the method further comprises compressing the first group of indirect blocks by encoding a first group of storage addresses corresponding to the first group of data blocks into the first indirect block.

According to a second aspect of the present disclosure, there is provided a device for compressing metadata in a file system. The metadata comprises a first group of indirect blocks. The device comprises at least one processing unit and at least one memory. The at least one memory is coupled to the at least one processing unit and stores instructions to be executed by the at least one processing unit. The instructions, when executed by the at least one processing unit, cause the device to: in response to receiving a first request for writing first data to a file, determine whether the first request is for an initial write to a storage area associated with a second indirect block in the first group of indirect blocks, the first group of indirect blocks at least including a first indirect block and the second indirect block; in response to the initial write, allocate a first group of data blocks for writing the first data on a storage device; and compress the first group of indirect blocks by encoding a first group of storage addresses corresponding to the first group of data blocks into the first indirect block.

According to a third aspect of the present disclosure, there is provided a method for reading compressed metadata in a file system. The method comprises, in response to receiving a second request for reading second data from a file, determining whether the second data is to be read from a storage area associated with a fifth indirect block in a fourth group of indirect blocks at least including a fourth indirect block and the fifth indirect block. The method further comprises, in response to determining that the second data is to be read from the storage area, determining from the fourth indirect block a second group of storage addresses of a second group of data blocks for storing the second data.

According to a fourth aspect of the present disclosure, there is provided a device for reading compressed metadata in a file system. The device comprises at least one processing unit and at least one memory. The at least one memory is coupled to the at least one processing unit and stores instructions to be executed by the at least one processing unit. The instructions, when executed by the at least one processing unit, cause the device to: in response to receiving a second request for reading second data from a file, determine whether the second data is to be read from a storage area associated with a fifth indirect block in a fourth group of indirect blocks at least including a fourth indirect block and the fifth indirect block; and in response to determining that the second data is to be read from the storage area, determine from the fourth indirect block a second group of storage addresses of a second group of data blocks for storing the second data.

According to a fifth aspect of the present disclosure, there is provided a computer program product, the computer program product being tangibly stored on a non-transient computer-readable medium and including computer executable instructions which, when being executed, cause the computer to perform any step of any of the method according to the first aspect of the present disclosure.

According to a sixth aspect of the present disclosure, there is provided a computer program product, the computer program product being tangibly stored on a non-transient computer-readable medium and including computer executable instructions which, when being executed, cause the computer to perform any step of any of the method according to the third aspect of the present disclosure.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The above and other objectives, features and advantages of the present disclosure will become more apparent from more detailed description of some embodiments of the present disclosure with reference to the accompanying drawings, in which the same reference symbols are used to indicate the same elements.

DETAILED DESCRIPTION OF EMBODIMENTS

Some preferable embodiments will be described in more detail with reference to the accompanying drawings, in which the preferable embodiments of the present disclosure have been illustrated. However, the present disclosure can be implemented in various manners, and thus should not be construed to be limited to the embodiments disclosed herein. Rather, those embodiments are provided for thorough and complete understanding of the present disclosure, and completely conveying the scope of the present disclosure to those skilled in the art.

The term "comprise" and its variations used in the present disclosure mean comprising in an open-ended sense, i.e. "include without limitation". Unless otherwise specified, the term "or" means "and/or". The term "based on" means "at least partially based on". The terms "one exemplary embodiment" and "one embodiment" represent "at least one embodiment"; the term "another embodiment" represents "at least one another embodiment". The terms "first", "second" and the like may refer to different or the same objects. Other explicit and implicit definitions might further be included in the following description.

Figure 1:
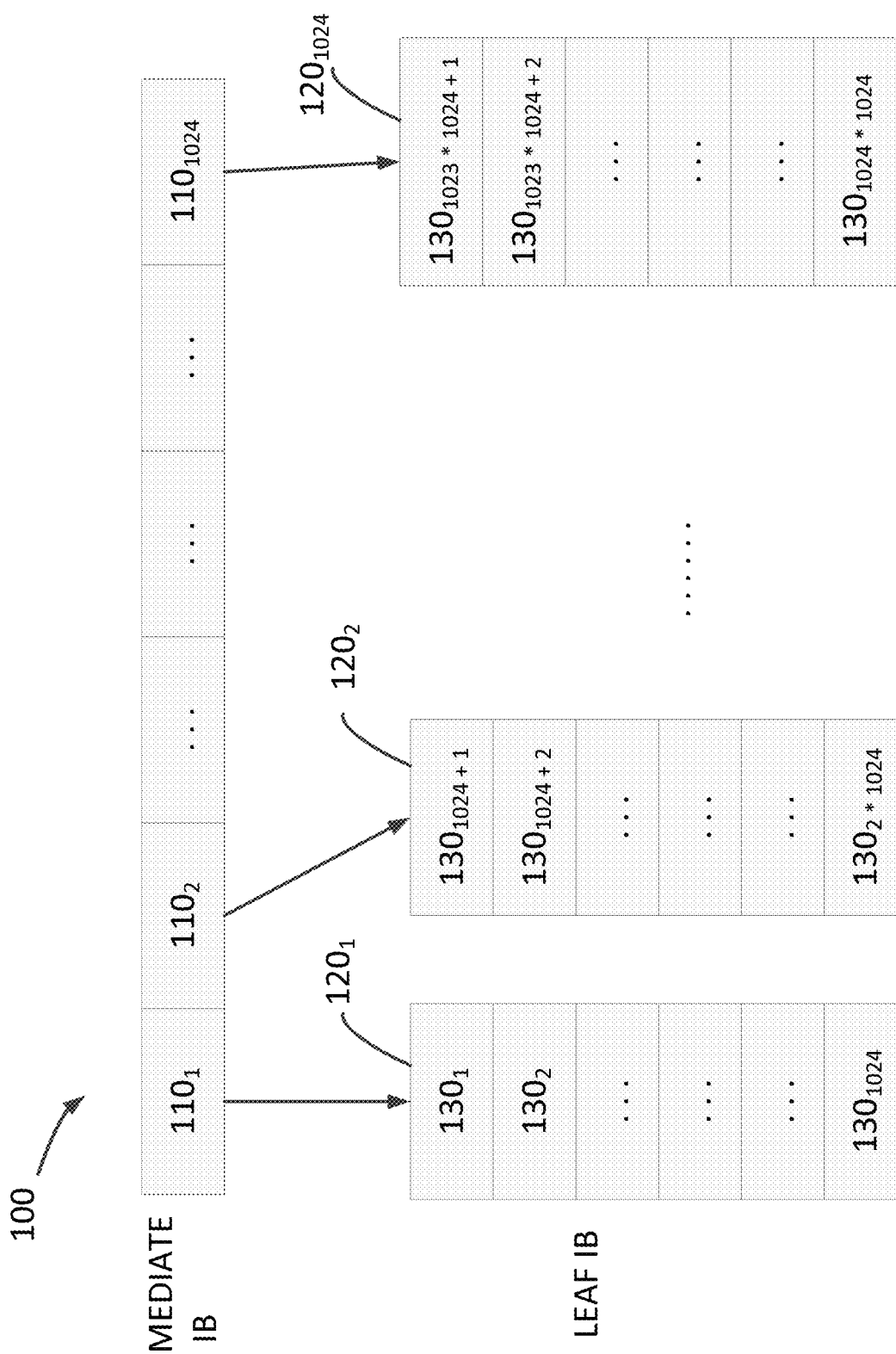
FIG. 1 shows a schematic diagram of a storage solution 100 for conventional IBs.

FIG. 1 shows a schematic diagram of a storage solution 100 for conventional IBs. Conventional IBs are organized in a hierarchy, where an IB at an upper level is used to store an address of an IB at a lower level, and an IB at the lowest level (i.e. a leaf IB) is used to store addresses of data blocks. For the sake of simplifying description, only two levels of IBs are shown in FIG. 1, namely leaf IBs and IBs (also referred to as "intermediate IBs" in this disclosure) at an upper level of the leaf IBs. It should be understood, however, the IB hierarchy may include more levels. In addition, only for the purpose of illustration, in FIG. 1 the size of each of the IBs and each of the data blocks is shown as 8 KB and the storage space occupied by each of the addresses (i.e., an address of an IB or an address of a data block, and also referred to as "mapping" below) is shown as 8 B. As shown in FIG. 1, an intermediate IB 110 may record addresses (i.e. IB address $110_1$, $110_2$ ... $110_{1024}$) of 1024 leaf IBs (i.e. IB $120_1$, $120_2$ ... $120_{1024}$) respectively. Meanwhile, each of the 1024 leaf IBs may record 1024 addresses of 1024 data blocks respectively. For example, the IB $120_1$ may record 1024 addresses $130_1$, $130_2$ ... $130_{1024}$ of 1024 data blocks, the IB $120_2$ may record 1024 addresses $130_{1024+1}$, $130_{1024+2}$ ... $130_{2\times1024}$ of 1024 data blocks, and the IB $120_{1024}$ may record 1024 addresses $130_{1023\times1024+1}$, $130_{1023\times1024+2}$ ... $130_{1024\times1024}$ of 1024 data blocks. It can be seen that although the flat layout adopted by conventional IBs is easy to lookup, it will lead to waste of memory spaces.

As Flash memory or non-volatile random access memory (NVRAM) is widely applied in storage systems, data can be aggregated before flushing to disks, so that a data set to be written is usually large and the pattern of the writes may appear continuous or partially continuous (i.e., data is written to continuous or partially continuous data block addresses). Such continuity or partial continuity makes it possible to compress metadata including IBs.

Exemplary embodiments of the present disclosure propose a solution for compressing file system metadata including IBs. By compressing and storing the above continuous or partially continuous data block addresses in IBs, the solution can reduce the number of IBs for storing data block addresses, thereby increasing memory efficiency.

Figure 2:
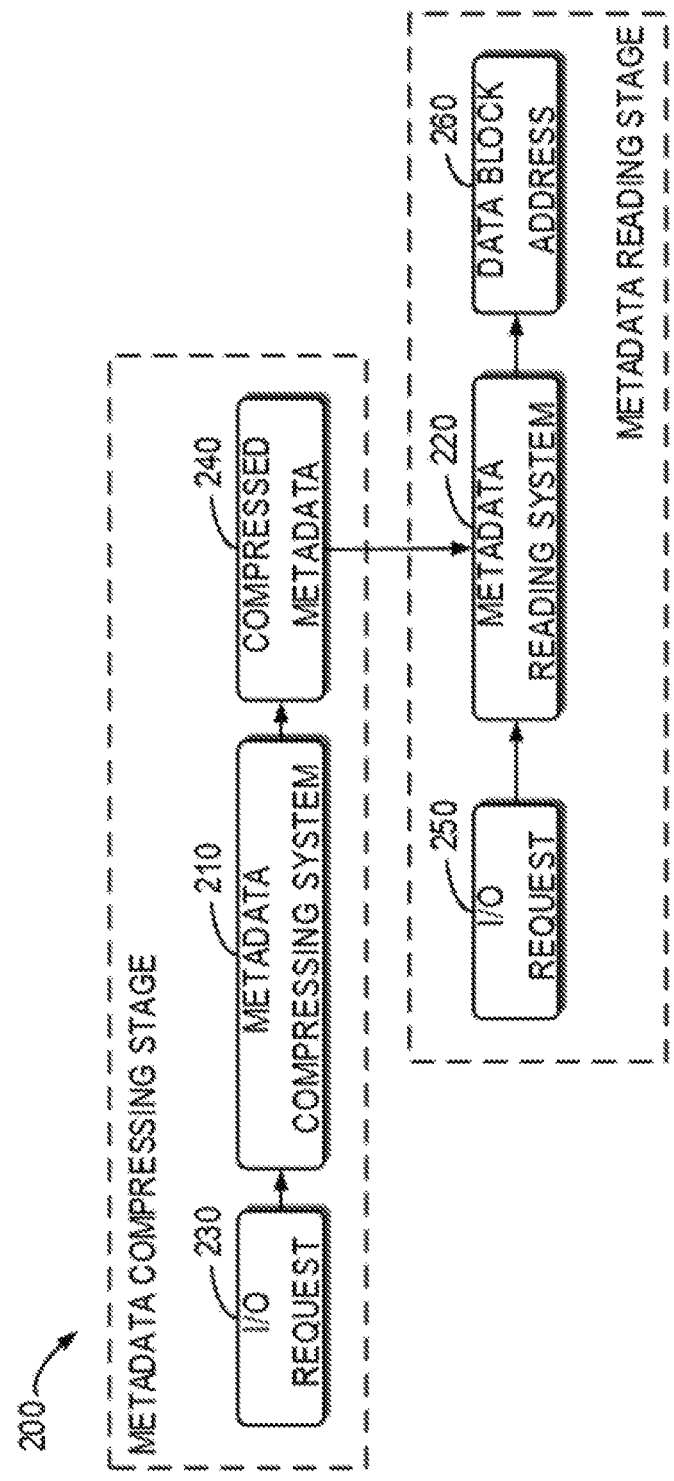
FIG. 2 shows a block diagram of an environment 200 which is applicable to implement the embodiments of the present disclosure.

FIG. 2 shows a block diagram of an environment 200 which is applicable to implement the embodiments of the present disclosure. It should be understood that the structure and functionalities of the environment 200 are described only for the purpose of illustration, rather than suggesting any limitation to the scope of the present disclosure. The present disclosure may be embodied in different structures and/or functionalities.

As shown in FIG. 2, the environment 200 may generally comprise a metadata compressing system 210 and a metadata reading system 220. According to the implementation of the subject matter described in the present specification, the solution for compressing file system metadata including IBs may comprise two stages, namely a metadata compressing stage and a metadata reading stage.

At the metadata compressing stage, the metadata compressing system 210 may be configured to receive an input/output (I/O) request 230 and generate compressed metadata 240 based on the I/O request 230. Since the initial data distribution may greatly affect the data access performance, in some embodiments of the present disclosure, the compression of the metadata may be implemented during the initial data write (i.e., the first write to a certain storage area). In this case, the I/O request 230 may comprise a request for first writing a certain length of data to a start location (also referred to as an offset in the present specification) in the file.

At the metadata reading stage, the metadata reading system 220 may be configured to receive an I/O request 250 and read compressed metadata 240 based on the I/O request 250, so as to obtain an address 260 of a data block in the file. The I/O request 250 may comprise a request for reading a certain length of data from the file or a request for rewriting a certain length of data in the file.

With the solution for compressing metadata in a file system according to embodiments of the present disclosure, compressed metadata does not have to be de-compressed during the reading (or rewriting) of the data, such that the efficiency of memory utilization can be improved as much as possible without affecting the performance of data reading. Hereinafter, the embodiments of the present disclosure will be described in more detail with reference to FIGS. 3 to 8.

Figure 3:
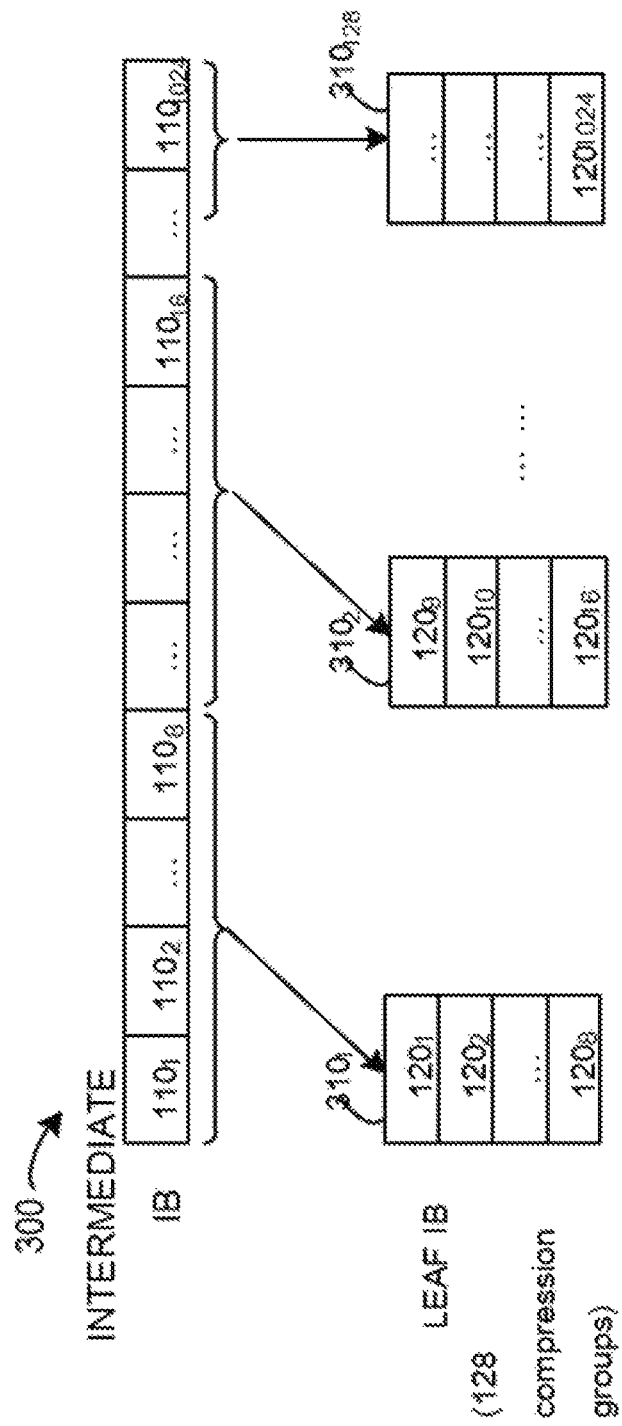
FIG. 3 shows a schematic diagram 300 of compressing metadata in a file system according to an embodiment of the present disclosure.

FIG. 3 shows a schematic diagram of compressing metadata in a file system according to an embodiment of the present disclosure. Hereinafter, the solution for compressing metadata in a file system according to embodiments of the present disclosure will be described in detail by comparison with that as shown in FIG. 1. For the purpose of simplifying description, only two levels of IBs are shown in FIG. 3, namely leaf IBs and intermediate IBs. For example, an intermediate IB 110 may records addresses (i.e., IB addresses $110_1, 110_2 \ldots 110_{1024}$) of 1024 leaf IBs (i.e., IBs $120_1, 120_2 \ldots 120_{1024}$). In particular, The 1024 leaf IBs are divided into a plurality of groups (each of which is also referred to as a "compression group" below), and the number of leaf IBs in each of the plurality of compression groups may be, for example, 2 to 16. As shown in FIG. 3, the number of leaf IBs in each compression group is 8, so the 1024 leaf IBs (i.e., IBs $120_1, 120_2 \ldots 120_{1024}$) may be divided into 128 compression groups (i.e., compression groups $310_1, 310_2 \ldots 310_{128}$). Each compression group may have a leader IB and follower IBs. Taking the compression group $310_1$ as an example, it may comprise IBs $120_1$, $120_2 \ldots 120_8$, among which the IB $120_1$ (whose logical offset mod 8 equals 0) is referred to as the "leader IB" and the IBs $120_2, 120_3 \ldots 120_8$ are generally referred to as the "follower IBs". Similarly, regarding the compression group $310_2$, its leader IB is IB $120_9$ and its follower IBs comprise IBs $120_{10}, 120_{11} \ldots 120_{16}$. Different from the traditional IB storage solution as shown in FIG. 1 where each of the leaf IBs may record addresses of data blocks associated with the leaf IB, the solution for compressing metadata according to embodiments of the present disclosure may encode addresses of data blocks associated with each IB in a compression group into the leader IB of the compression group. For example, as shown in FIG. 3, addresses of data blocks associated with the compression group $310_1$ are encoded into the IB $120_1$, and addresses of data blocks associated with the compression group $310_2$ are encoded into IB $120_9$, and so on. Therefore, embodiments of the present disclosure can reduce the number of IBs used for storing the addresses of data blocks, thereby improving memory efficiency.

Figure 4:
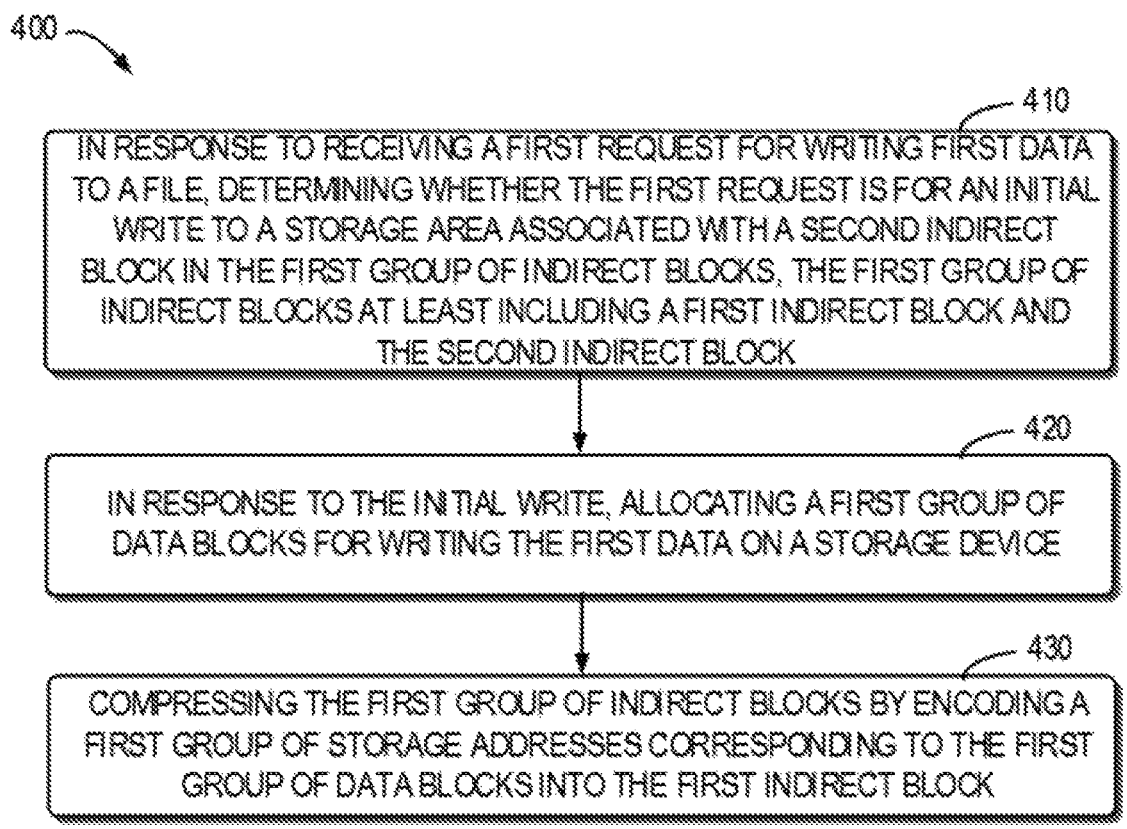
FIG. 4 shows a flowchart of a method 400 for compressing metadata in a file system according to an embodiment of the present disclosure.

FIG. 4 shows a flowchart of a method 400 for compressing metadata in a file system according to an embodiment of the present disclosure. Detailed description of the method 400 is presented below in conjunction with FIGS. 2 and 3. For example, the method 400 may be executed by the metadata compressing system 210 as shown in FIG. 2. It should be understood that the method 400 may further include additional acts that are not shown and/or omit some acts as shown. The scope of the present disclosure is not limited in this regard.

In act 410, in response to receiving a first request for writing first data to a file, the metadata compressing system 210 determines whether the first request is for an initial write to a storage area associated with a second indirect block in a first group of indirect blocks at least including a first indirect block and the second indirect block. In the following discussions, only for the purpose of illustration, for example, the compression group $310_1$ as shown in FIG. 3 is used to represent the "first group of indirect blocks" mentioned here and the "first indirect block" may refer to the leader IB (i.e., the IB $120_1$) in the compression group $310_1$ and the "second indirect block" may refer to any (e.g., the IB $120_2$) of follower IBs in the compression group $310_1$.

In some embodiments, the first request may include a first offset indicating a start location in the file to which the first data is written, and a first length of the first data to be written. In such embodiments, whether the first request is for an initial write to a storage area associated with IB $120_2$ may be determined based on the first offset and the first length. In this regard, FIG. 5 shows a schematic diagram of determining a leaf IB which corresponds to data to be written (or to be read) based on an offset in a file and a length of the data according to an embodiment of the present disclosure.

As described above, the metadata may further comprise an inode, which may record addresses of a few data blocks and addresses of several top-level IBs. For example, FIG. 5 shows an exemplary inode 510, which may record an address $521_1$ of a data block $520_1$, an address $521_1$ of a data block $520_1$ and an address $521_3$ of a data block $520_3$. In addition, the inode 510 may also record an address $531_1$ of an IB $530_1$, where the IB $530_1$ is a leaf IB and records addresses $521_4, 521_5 \ldots 521_{1027}$ of data blocks $520_4$, $520_5 \ldots 520_{1027}$. Therefore, the IB $530_1$ is also referred to as the top-level IB in a "tree with one level of IBs". Similarly, the inode 510 may further record an address of a top-level IB in a "tree with two levels of IBs", i.e., the address $541_1$ of the IB $540_1$. The IB $540_1$ is an intermediate IB, which may record 1024 addresses of 1024 leaf IBs. For the purpose of illustration, the IB $540_1$ is currently shown to record 3 addresses (i.e., IB addresses $551_1$, $551_2$ and $551_3$) of only 3 leaf IBs (i.e., IBs $550_1$, $550_2$ and $550_3$), while other addresses as recorded by the IB $540_1$ are invalid (e.g., 0xFF, indicating a corresponding leaf IB has not yet been created). For example, the IB $550_1$ may record addresses $521_{1028}$ and $521_{1029}$ of data blocks $520_{1028}$ and $520_{1029}$ (other data blocks are not shown in FIG. 5). Suppose the first request indicates that 8 KB data is to be written from the $8421376^{th}$ byte in the file, then first a sequence number of a corresponding logical data block can be calculated based on the offset (i.e., 8421376B) in the file, that is, 8421376B/8192B+1=1029. Then, it can be determined which intermediate IB is associated with the data to be written based on the sequence number of the logical data block. In some embodiments, this may be implemented by a simple lookup table. For example, as shown in FIG. 5, the $1^{st}$~$3^{rd}$ data blocks (i.e., the data blocks $520_1$, $520_2$ and $520_3$) are included in the inode 110. Data blocks corresponding to the one-level IB tree are the $4^{th}$~$1027^{th}$ data blocks (i.e., the data blocks $520_4$, $520_5 \ldots 520_{1027}$), and data blocks corresponding to the two-level IB tree are the $1028^{th}$~$(1024 \times 1024$-$1027)^{th}$ data blocks. Therefore, the $1029^{th}$ data block is associated with the IB $540_1$. Similarly, it may further be determined that the $1029^{th}$ data block is associated with the leaf IB $551_2$.

Figure 5:
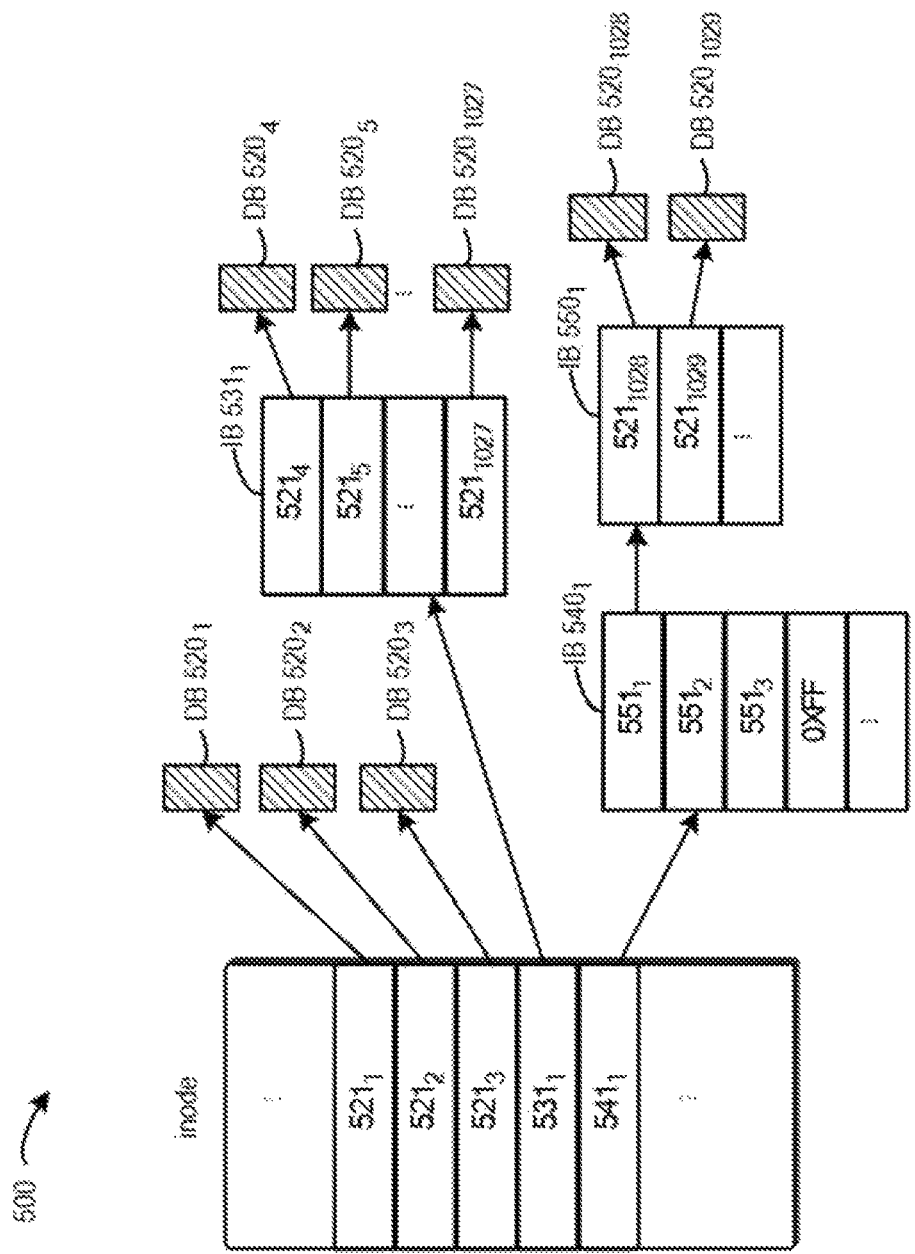
FIG. 5 shows a schematic diagram 500 of determining a leaf IB which corresponds to data to be written (or to be read) based on an offset in a file and a length of the data according to an embodiment of the present disclosure.
Figure 6:
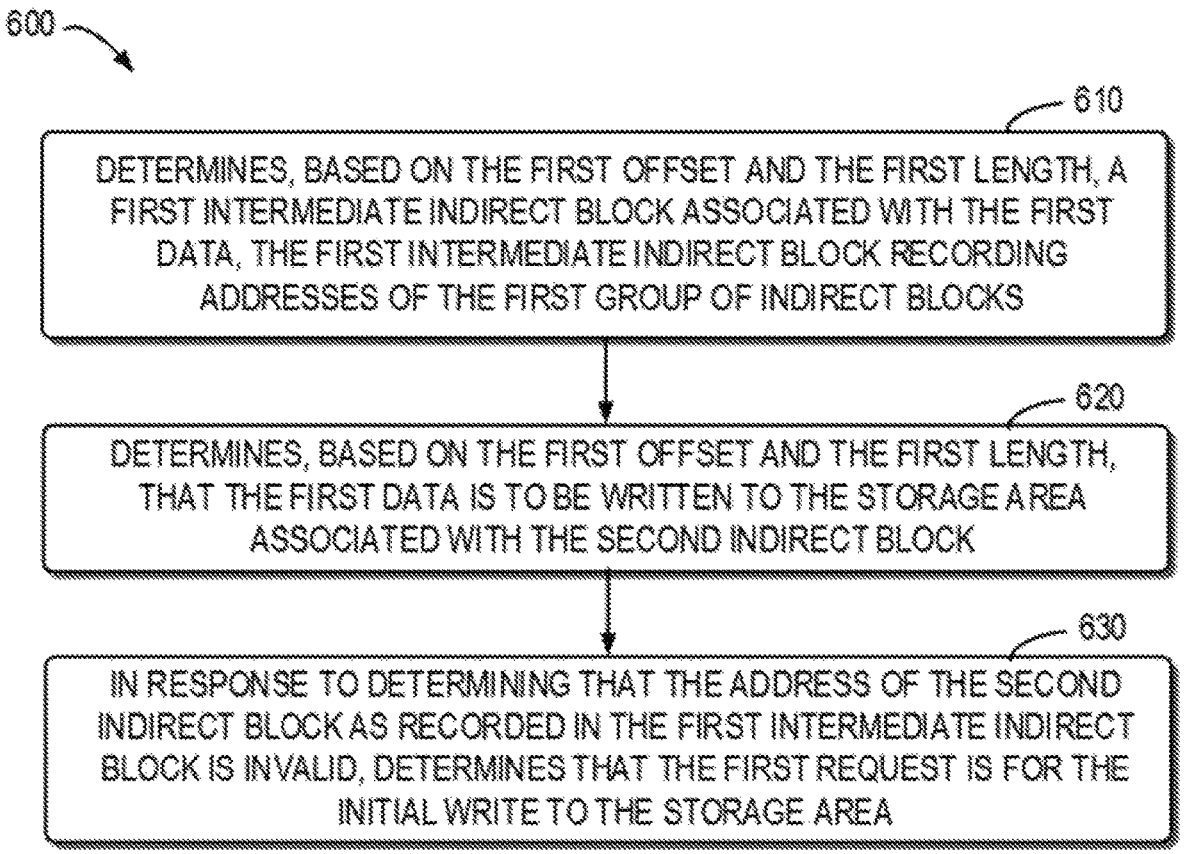
FIG. 6 shows a flowchart of a method 600 for determining whether a first request is for an initial write to a storage area associated with a second indirect block according to an embodiment of the present disclosure.

In the exemplary way as shown in FIG. 5, it can be determined, based on the first offset and the first length, that whether the first request is for an initial write to a storage area associated with the IB $120_2$. For example, FIG. 6 shows a flowchart of a method 600 for determining whether a first request is for an initial write to a storage area associated with a second indirect block according to an embodiment of the present disclosure. The method 600 may be regarded as one implementation of the act 410 in the method 400 and may be executed by the metadata compressing system 210 as shown in FIG. 2 for example. Detailed description of the method 600 is presented below in conjunction with FIG. 3.

In act 610, the metadata compressing system 210 determines, based on the first offset and the first length, a first intermediate indirect block associated with the first data, the first intermediate indirect block recording addresses of the first group of indirect blocks. For example, the metadata compressing system 210 may determine, based on the first offset and the first length, that the first intermediate IB associated with the first data is the IB 110, which may record an address of the compression group $310_1$. In act 620, the metadata compressing system 210 determines, based on the first offset and the first length, that the first data is to be written to the storage area associated with the second indirect block. Next, the method 600 proceeds to act 630, in which in response to determining that the address of the second indirect block as recorded in the first intermediate indirect block is invalid, the metadata compressing system 210 determines that the first request is for the initial write to the storage area associated with the second indirect block. For example, when the address of the IB $120_2$ as recorded in the IB 110 is 0xFF, it can be determined that the first request is for an initial write to the storage area associated with the IB $120_2$.

Returning to FIG. 4, the method 400 proceeds to act 420. In this act, in response to the initial write, a first group of data blocks for writing the first data is allocated on a storage device. For example, a first group of data blocks corresponding to the length of the first data may be allocated on a disk. Additionally or alternatively, a space (e.g. 8 KB) for storing the second indirect block IB $120_2$ may further be allocated on the disk (rather than the memory), such that each IB can have its independent physical address on the disk so as to be compatible with the traditional IB storage solution. The allocated first group of data blocks is logically continuous data blocks, whereas a group of physical storage addresses corresponding to the first group of data blocks might be continuous, partially continuous or discontinuous.

In act 430, the first group of indirect blocks is compressed by encoding a first group of storage addresses corresponding to the first group of data blocks into the first indirect block.

In some embodiments, the first indirect block (i.e., the leader IB) may be determined based on a second indirect block (i.e., a follower IB) in the compression group to which the first indirect block belongs. For example, the address of the leader IB (i.e., the IB $120_1$) stored in the IB 110 may be determined based on an offset of the address of the IB $120_2$ in the IB 110 as well as the number of indirect blocks included by each compression group. In some embodiments, the determined address (stored in the IB 110) of the IB $120_1$ might be 0xFF, which may indicate that the IB $120_1$ has not yet been created. In this case, a space (e.g., 8 KB) for storing the IB $120_1$ may need to be allocated in a disk and/or memory. Then, the first group of storage addresses corresponding to the first group of data blocks may be encoded into the first indirect block (i.e., the IB $120_1$). In some embodiments, different from the flat layout of the traditional IB storage solution, the in-memory layout of the first indirect block can utilize the continuity (or partial continuity), which might exist in addresses of data blocks, to achieve the purpose of compressing more addresses of data blocks into the first indirect block than the traditional IB storage solution. In the present description, an IB in such an in-memory layout is also referred to as a "compressed IB".

Figure 7:
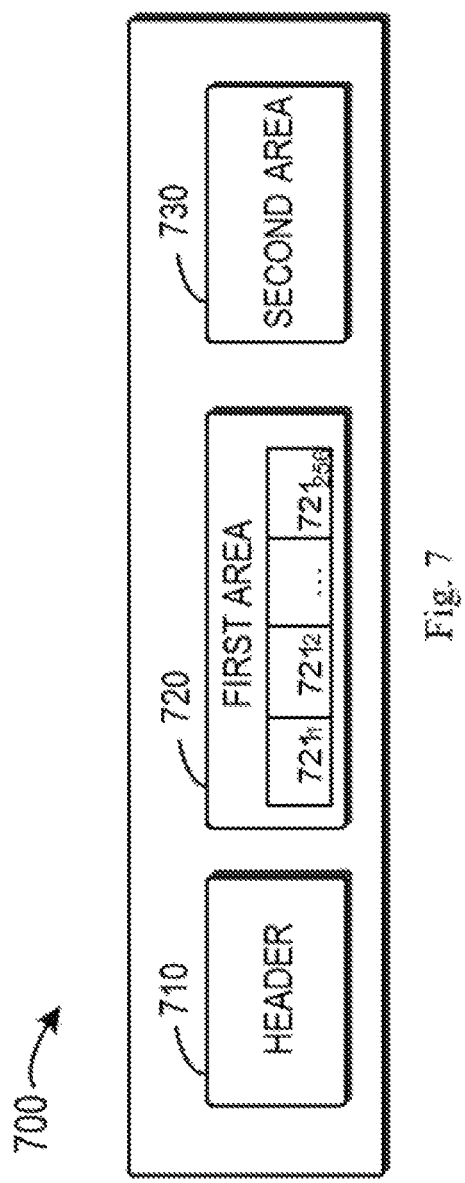
FIG. 7 shows a schematic diagram of an in-memory layout 700 of a compressed IB according to an embodiment of the present disclosure.
Figure 8:
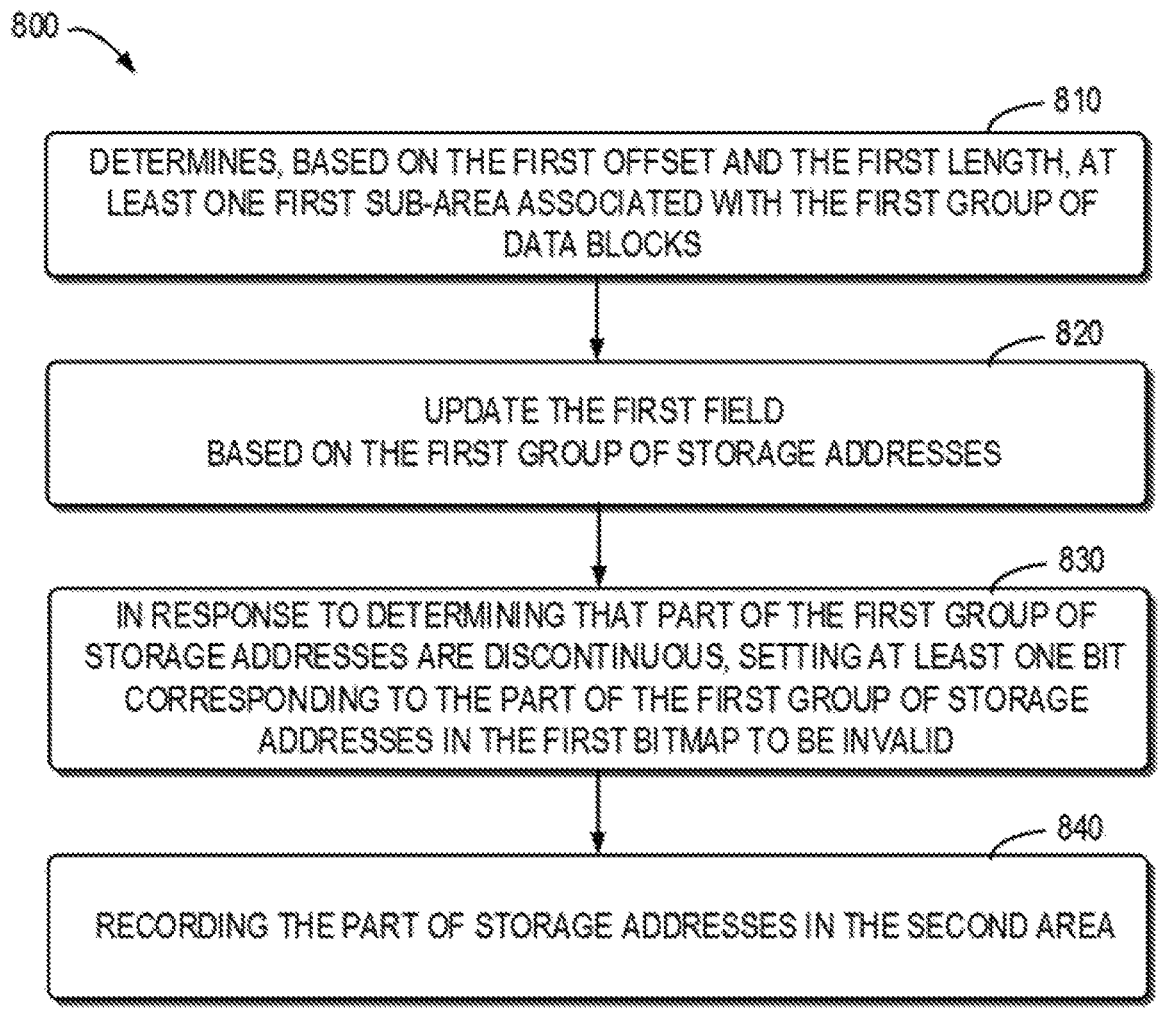
FIG. 8 shows a flowchart of a method 800 for encoding a first group of storage addresses corresponding to a first group of data blocks into a first indirect block according to an embodiment of the present disclosure.

In this regard, FIG. 7 shows a schematic diagram of an in-memory layout 700 of a compressed IB according to an embodiment of the present disclosure. As shown in FIG. 7, the compressed LB (for the purpose of illustration, still with a size of 8 KB) may comprise a header 710, a first area 720 and a second area 730. The header 710 may be a fixed-length (e.g., 64 B) area, which may provide overall information of the compressed IB, such as version number, status, predefined flags, count of current actually-stored mappings (e.g., data block addresses), memory usage and an storage address (e.g., disk address) of a follower IB, etc. The first area 720 may be used to compress continuous storage addresses, and may comprise a plurality (e.g., 256) of first sub-areas (i.e., first sub-areas $721_1$, $721_2$ ... $721_{256}$), each of which may correspond to a same number (e.g., 32) of data blocks. Therefore, the first area 720 may record data block addresses (i.e., 256×32=8192) corresponding to one compression group. In addition, for example, each first sub-area (e.g., with a length of 12 B) may comprise a first field (e.g., with a length of 8 B) for indicating a storage address of a start data block among the 32 data blocks, and a first bitmap (e.g., with a length of 4 B) for indicating whether a respective storage address of each of the 32 data blocks is valid. The second area 730 may record non-continuous storage addresses (or non-compressed addresses). For example, it may record addresses of a plurality of non-continuous data blocks and a respective offset of each of the data blocks in the compression group. With the in-memory layout of the compressed IB as shown in FIG. 7, the first group of storage addresses corresponding to the first group of data blocks may be encoded into the first indirect block (i.e., the IB $120_1$). For example, FIG. 8 shows a flowchart of a method 800 for encoding the first group of storage addresses corresponding to the first group of data blocks into the first indirect block according to an embodiment of the present disclosure. The method 800 may be regarded as one implementation of act 430 in the method 400, and may be executed by the metadata compressing system 210 as shown in FIG. 2 for example.

In act 810, the metadata compressing system 210 determines, based on the first offset and the first length, at least one first sub-area associated with the first group of data blocks. As shown in FIG. 7, the first area 720 may record data block addresses (e.g., 8192 data block addresses) corresponding to one compression group, and each of the first sub-areas may correspond to the same number (e.g., 32) of data blocks. Therefore, a logic sequence number of the first group of data blocks may be determined based on the first offset and the first length at first, and then at least one first sub-area associated with the first group of data blocks may be determined based on the logic sequence number. The method 800 proceeds to act 820, in which the metadata compressing system 210 updates the first field (which may indicate a storage address of a start data block among the same number of data blocks) in the at least one first sub-area based on the first group of storage addresses corresponding to the first group of data blocks. Next, in act 830, the metadata compressing system 210 sets the first bitmap (which may indicate whether a respective storage address of each of the same number of data blocks is valid) in the at least one first sub-area based on the first group of storage addresses. Specifically, when it is determined that part of storage addresses in the first group of storage addresses are discontinuous, at least one bit corresponding to this part of storage addresses in the first bitmap are set to be invalid. Then in act 840, the metadata compressing system 210 records this part of storage addresses in the second area (e.g., the second area 730 shown in FIG. 7) individually.

In some embodiments, after the initial write to the storage area associated with the second indirect block (i.e., the IB 120$_2$) is completed, the address of the second indirect block may be updated in the first intermediate indirect block (i.e., the IB 110) with the address of the first indirect block (i.e., IB 1201), such that the second indirect block points to the first indirect block.

Figure 9A:
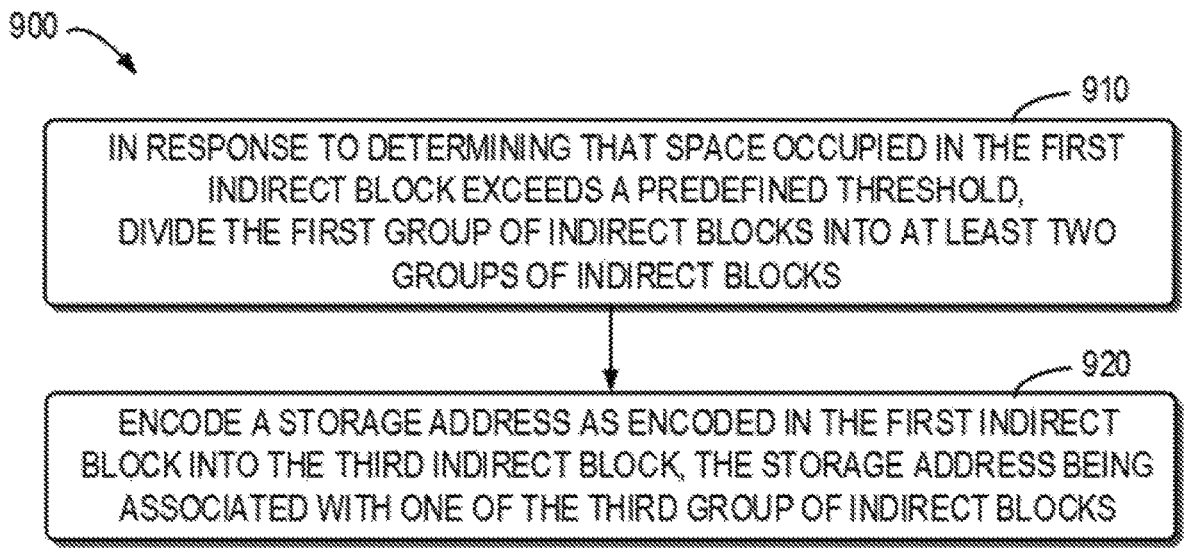
FIG. 9A shows a flowchart of a method 900 for dividing the first group of indirect blocks according to an embodiment of the present disclosure.

In some embodiments of the present disclosure, optionally, the method 400 may further comprise a process for a case in which excessive space in the first indirect block is occupied. Specifically, this problem may be solved by dividing the first group of indirect blocks. FIG. 9A shows a flowchart of a method 900 for dividing a first group of indirect blocks according to an embodiment of the present disclosure. In act 910, in response to determining that space occupied in the first group of indirect blocks exceeds a predefined threshold, the first group of indirect blocks is divided into at least two groups of indirect blocks, which include a second group of indirect blocks and a third group of indirect blocks, the second group of indirect blocks including the first indirect block and the third group of indirect blocks at least including a third indirect block. In act 920, a storage address as encoded in the first indirect block, which is associated with one of the third group of indirect blocks, is encoded into the third indirect block.

Figure 9B:
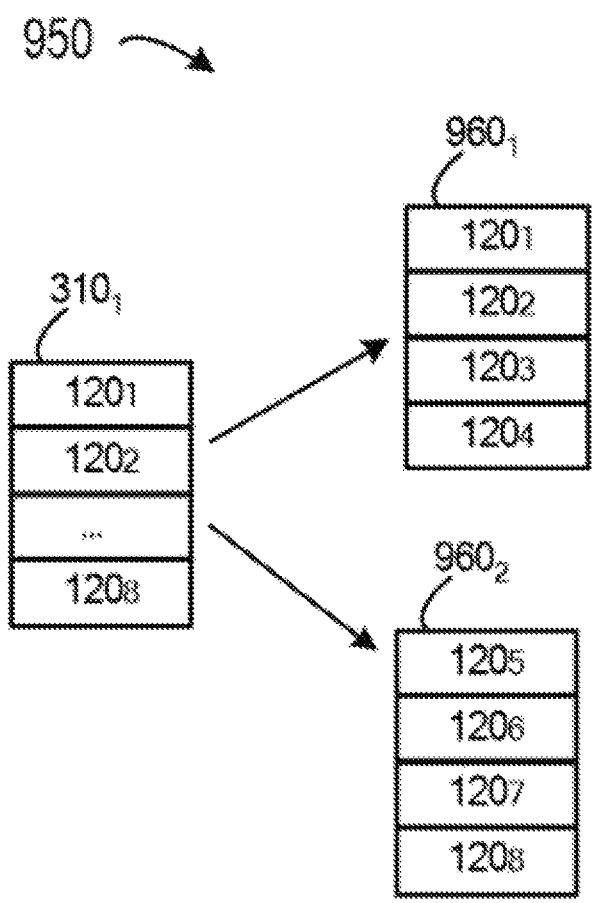
FIG. 9B shows a schematic diagram 950 of dividing the first group of indirect blocks according to an embodiment of the present disclosure.

FIG. 9B shows a schematic diagram 950 of dividing the first group of indirect blocks according to an embodiment of the present disclosure. In FIG. 9B, a first indirect block refers to the IB 120$_1$, and the first group of indirect blocks refers to the compression group 310$_1$. When space occupied in IB 120$_1$ exceeds a predefined threshold (e.g., 50%), the first group of indirect blocks 310$_1$ may be divided into two groups of indirect blocks, namely a second group of indirect blocks 960$_1$ and a third group of indirect blocks 960$_2$. The second group of indirect blocks 960$_1$ may include the first indirect block IB 120$_1$ and indirect blocks IB 120$_1$ to IB 120$_4$, and the third group of indirect blocks may include indirect blocks IB 120$_5$ to IB 120$_8$. Any of IB 120$_5$ to IB 120$_8$ may act as a third indirect block. In this example, the IB 120$_5$ may act as the third indirect block, and then storage addresses associated with IB 120$_5$ to IB 120$_8$ in third group of indirect blocks 960$_2$, which are included in a plurality of storage addresses originally encoded in the first indirect block 120$_1$, may be encoded into the third indirect block IB 120$_5$.

It should be understood that the embodiment is shown in FIG. 9B merely for the purpose of illustration instead of suggesting any limitation. Those skilled in the art may readily appreciate that the first group of indirect blocks may not be divided into only two groups but also may be divided into four groups or other appropriate number of groups in other embodiments. In addition, the second group of indirect blocks 960$_1$ or the third group of indirect blocks 960$_2$ may be divided further in response to an appropriate event. As an example, when space occupied in the first indirect block IB 120$_1$ of the second group of indirect blocks 960$_1$ exceeds a predefined threshold, the second group of indirect blocks 960$_1$ may be divided further. For another example, when space occupied in the third indirect block IB 120$_5$ of the third group of indirect blocks 960$_2$ exceeds the predefined threshold, the third group of indirect blocks 960$_2$ may be divided further.

Figure 10:
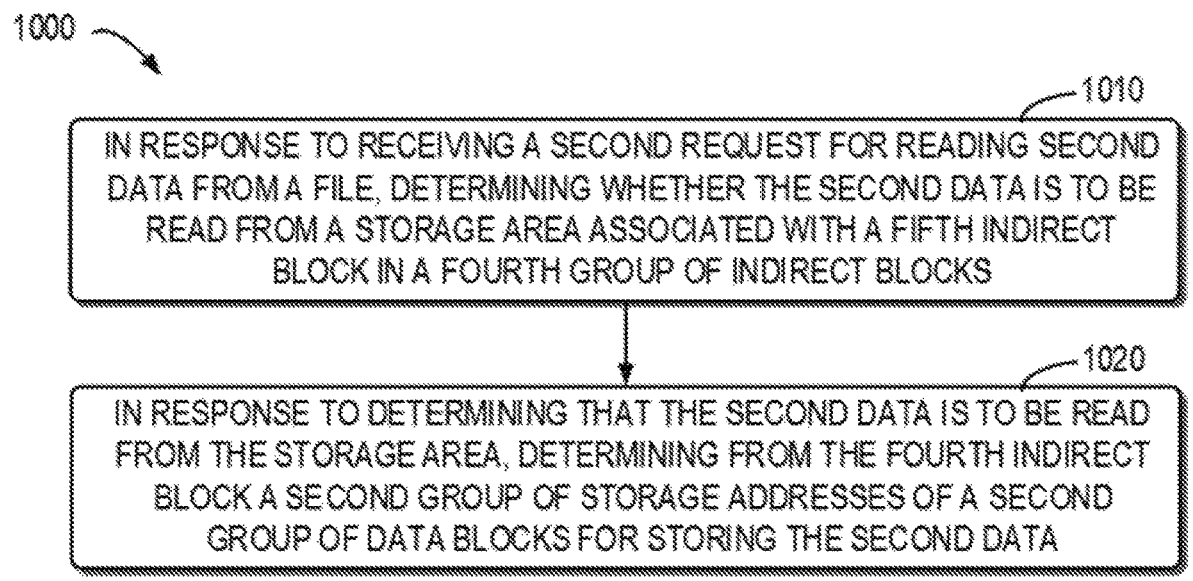
FIG. 10 shows a flowchart of a method 1000 for reading compressed metadata in a file system according to an embodiment of the present disclosure.

FIG. 10 shows a flowchart of a method 1000 for reading compressed metadata in a file system according to an embodiment of the present disclosure. The method 1000 may be executed by, for example, the metadata reading system 220 as shown in FIG. 2. It should be understood that method 1000 may further comprise additional acts that are not shown and/or omit some acts as shown. The scope of the present disclosure is not limited in this regard.

In act 1010, in response to receiving a second request for reading second data from a file, the metadata reading system 220 may determine whether the second data is to be read from a storage area associated with a fifth indirect block in a fourth group of indirect blocks at least including a fourth indirect block and the fifth indirect block.

In some embodiments, the second request may comprise a second offset indicating a start location in the file to which the second data is written, and a second length of the second data. In such embodiments, whether the second data is to be read from the storage area associated with the fifth indirect block may be determined in various manners. For example, a second intermediate indirect block associated with the second data may be determined based on the second offset and the second length, which may record at least one address of the fourth group of indirect blocks. Then, the metadata reading system 220 may determine, based on the second offset and the second length, that the second data is to be read from the storage area associated with the fifth indirect block.

In act 1020, in response to determining that the second data is to be read from the storage area, the metadata reading system 220 may determine from the fourth indirect block a second group of storage addresses of a second group of data blocks for storing the second data. In some embodiments of the present disclosure, the metadata reading system 220 may determine from the fourth indirect block the second group of storage addresses of the second group of data blocks for storing the second data in various manners. In some embodiments, the fourth indirect block in the fourth group of indirect blocks may be determined based on the fifth indirect block.

Alternatively, in some embodiments, the second request may comprise a second offset indicating a start location in the file to which the second data is written, and a second length of the second data. Furthermore, the fourth indirect block may comprise a third area for compressing continuous storage addresses. The third area may comprise a plurality of third sub-areas, each of which may correspond to a same number of data blocks. In such embodiments, at least one third sub-area associated with the second group of data blocks may be determined based on the second offset and the second length, and the second group of storage areas may be determined from the at least one third sub-area.

The second group of storage addresses may be determined from the at least one third sub-area in various ways. In one embodiment, the at least one third sub-area may comprise a second field indicating a storage address of a start data block in the same number of data blocks and a second bitmap indicating whether a respective storage address of each of the same number of data blocks is valid. In this embodiment, a first storage address in the second group of storage addresses, which corresponds to a valid bit contained in the second bitmap, may be determined based on the second field and the valid bit.

Alternatively, in some embodiments, the fourth indirect block may further include a fourth area for recording discontinuous storage addresses. In these embodiments, in response to an invalid bit existing in the second bitmap, a second storage address corresponding to the invalid bit in the second group of storage addresses may be determined from the fourth area.

Figure 11:
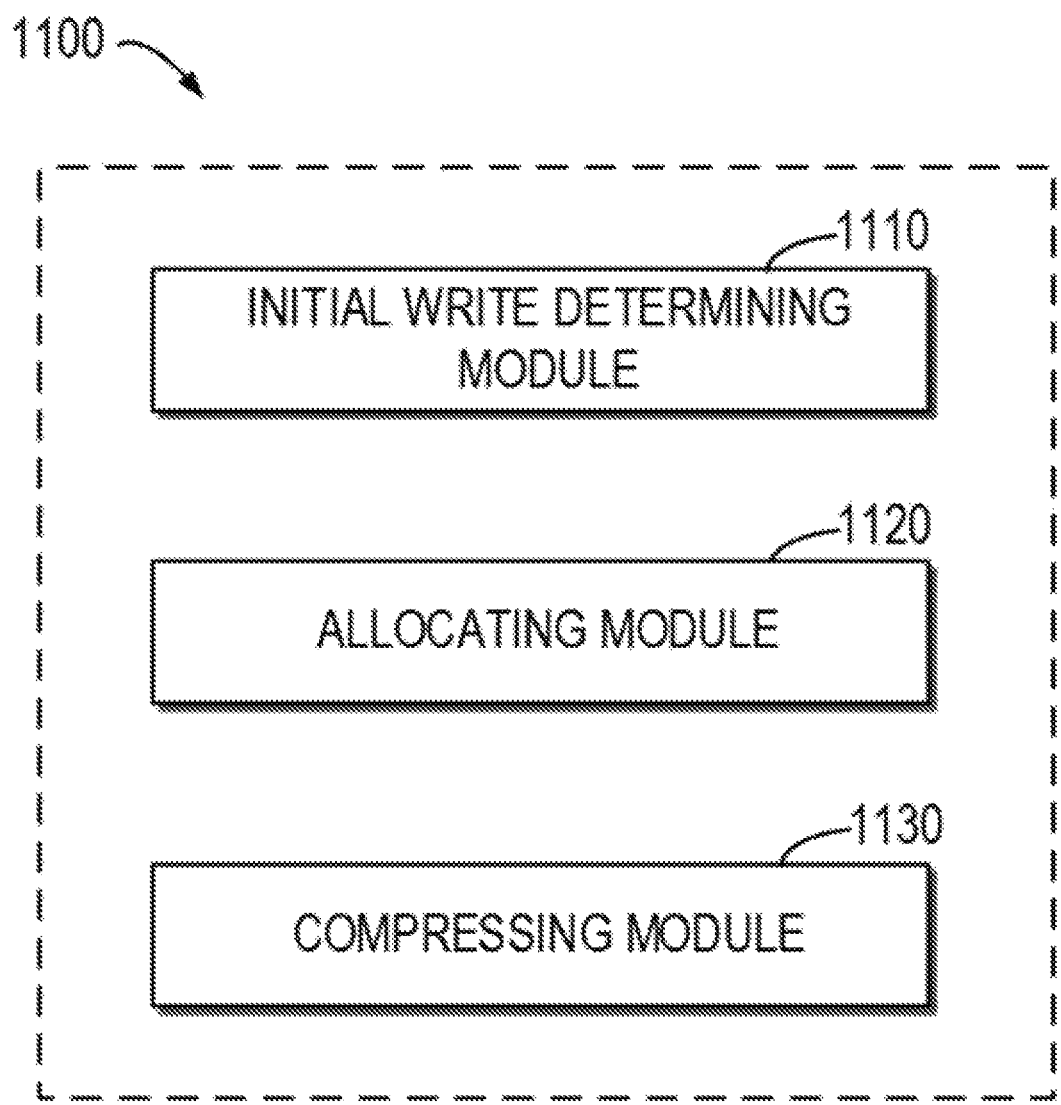
FIG. 11 shows a block diagram of an apparatus 1100 for compressing metadata in a file system according to an embodiment of the present disclosure.

FIG. 11 shows a block diagram of an apparatus 1100 for compressing metadata in a file system according to an embodiment of the present disclosure. For example, the metadata compressing system 210 may be implemented by the apparatus 1100. As shown in FIG. 11, the apparatus 1100 may comprise an initial write determining module 1110, an allocating module 1120 and a compressing module 1130. The initial write determining module 1100 is configured to determine, in response to receiving a first request for writing first data to a file, whether the first request is for an initial write to a storage area associated with a second indirect block in the first group of indirect blocks, the first group of indirect blocks at least including a first indirect block and the second indirect block. The allocating module 1120 is configured to allocate, in response to the initial write, a first group of data blocks for writing the first data on a storage device. The compressing module 1130 is configured to compress the first group of indirect blocks by encoding a first group of storage addresses corresponding to the first group of data blocks into the first indirect block.

In some embodiments, the first request may include a first offset indicating a start location in the file to which the first data is written, and a first length of the first data. In these embodiments, the initial write determining module 1110 may be further configured to: determine, based on the first offset and the first length, a first intermediate indirect block associated with the first data, the first intermediate indirect block recording at least one address of the first group of indirect blocks; determine, based on the first offset and the first length, that the first data is to be written to the storage area associated with the second indirect block; and in response to determining that an address of the second indirect block as recorded in the first intermediate indirect block is invalid, determine that the first request is for the initial write to the storage area.

In some embodiments, the compressing module 1130 may be further configured to determine, based on the second indirect block, the first indirect block in the first group of indirect blocks.

In some embodiments, the first indirect block may include a first area for compressing continuous storage addresses, the first area including a plurality of first sub-areas, each of the plurality of first sub-areas corresponding to a same number of data blocks. In these embodiments, the compressing module 1130 may be further configured to determine, based on the first offset and the first length, at least one first sub-area associated with the first group of data blocks, the at least one first sub-area being included in the plurality of first sub-areas; and encode the first group of storage addresses into the at least one first sub-area.

In some embodiments, the at least one first sub-area may include a first field indicating a storage address of a start data block in the same number of data blocks and a first bitmap indicating whether a respective storage address of each of the same number of data blocks is valid. In these embodiments, the compressing module 1130 may further be configured to: update the first field based on the first group of storage addresses; and in response to determining that part of the first group of storage addresses are discontinuous, set at least one bit corresponding to the part of the first group of storage addresses in the first bitmap to be invalid. In other embodiments, the first indirect block may further include a second area for recording discontinuous storage addresses, and the compressing module 1130 may further be configured to record the part of storage addresses in the second area.

In some embodiments, the apparatus 1100 may further comprise: an address updating module (not shown) configured to, after completing the initial write, update in the first intermediate indirect block the address of the second indirect block with an address of the first indirect block such that the second indirect block points to the first indirect block.

In some embodiments, the apparatus 1100 may further comprise: a dividing module (not shown) configured to divide, in response to determining that space occupied in the first indirect block exceeds a predefined threshold, the first group of indirect blocks into at least two groups of indirect blocks, the at least two groups of indirect blocks including a second group of indirect blocks and a third group of indirect blocks, the second group of indirect blocks including the first indirect block and the third group of indirect blocks at least including a third indirect block; and encode a storage address as encoded in the first indirect block into the third indirect block, the storage address being associated with one of the third group of indirect blocks.

Figure 12:
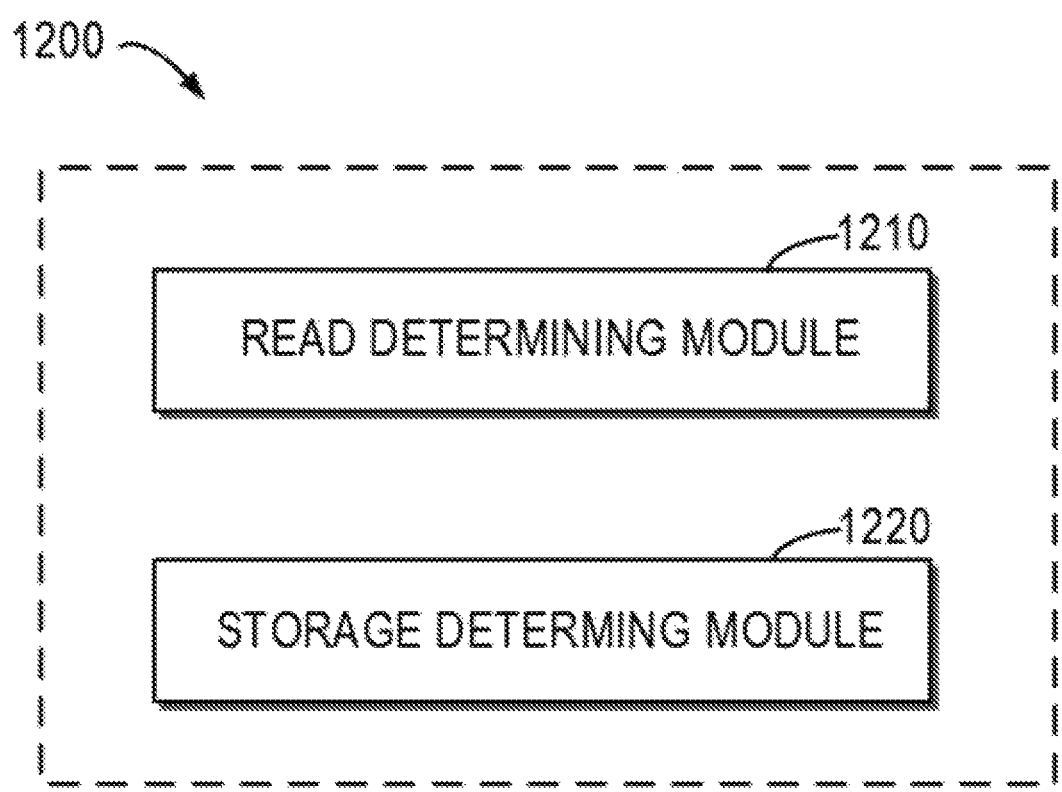
FIG. 12 shows a block diagram of an apparatus 1200 for reading compressed metadata in a file system according to an embodiment of the present disclosure.

FIG. 12 shows a block diagram of an apparatus 1200 for reading compressed metadata in a file system according to an embodiment of the present disclosure. For example, the metadata reading system 220 may be implemented by the apparatus 1200. As shown in FIG. 12, the apparatus 1200 may comprise a read determining module 1210 and a storage determining module 1220. The read determining module 1210 is configured to determine, in response to receiving a second request for reading second data from a file, whether the second data is to be read from a storage area associated with a fifth indirect block in a fourth group of indirect blocks at least including a fourth indirect block and the fifth indirect block. The storage determining module 1220 is configured to determine from the fourth indirect block, in response to determining that the second data is to be read from the storage area, a second group of storage addresses of a second group of data blocks for storing the second data.

In some embodiment, the second request may include a second offset indicating a start location in the file to which the second data is written, and a second length of the second data, and the read determining module 1220 is further configured to: determine, based on the second offset and the second length, a second intermediate indirect block associated with the second data, the second intermediate indirect block recording at least one address of the fourth group of indirect blocks; and determine, based on the second offset and the second length, that the second data is to be read from the storage area associated with the fifth indirect block.

In some embodiments, the storage determining module 1220 may be further configured to determine, based on the fifth indirect block, the fourth indirect block in the fourth group of indirect blocks.

In some embodiments, the fourth indirect block may include a third area for compressing continuous storage addresses, the third area including a plurality of third sub-areas, each of the plurality of third sub-areas corresponding to a same number of data blocks. In these embodiments, the storage determining module 1220 may be further configured to: determine, based on the second offset and the second length, at least one third sub-area associated with the second group of data blocks, the at least one third sub-area being included in the plurality of third sub-areas; and determine the second group of storage addresses from the at least one third sub-area.

In some embodiments, the at least one third sub-area may include a second field indicating a storage address of a start data block in the same number of data blocks and a second bitmap indicating whether a respective storage address of each of the same number of data blocks is valid. In these embodiments, the storage determining module 1220 is further configured to determine the second group of storage addresses from the at least one third sub-area by determining, based on the second field and a valid bit contained in the second bitmap, a first storage address corresponding to the valid bit in the second group of storage addresses.

In some embodiments, the fourth indirect block may further include a fourth area for recording discontinuous storage addresses, and the storage determining module 1220 may be further configured to determine the second group of storage addresses of the second group of data blocks from the fourth indirect block by determining from the fourth area, in response to an invalid bit existing in the second bitmap, a second storage address corresponding to the invalid bit in the second group of storage addresses.

For the sake of clarity, some optional modules of the apparatuses 1100 and 1200 are not shown in FIG. 11 and FIG. 12. However, it should be understood that respective features described with reference to FIGS. 2-9 are likewise applicable to the apparatus 1100 and respective features described with reference to FIG. 10 are likewise applicable to the apparatus 1200. Furthermore, various modules of the apparatuses 1100 and 1200 may be hardware modules or software modules. For example, in some embodiments, apparatuses 1100 and 1200 may be implemented partially or completely with software and/or firmware, for example, implemented as a computer program product embodied on a computer readable medium. Alternatively or additionally, the apparatuses 1100 and 1200 may be implemented partially or completely based on hardware, for example, implemented as an integrated circuit (IC) chip, application-specific integrated circuit (ASIC), system on chip (SOC), field programmable gate array (FPGA) etc. The scope of the present disclosure is not limited in this regard.

Figure 13:
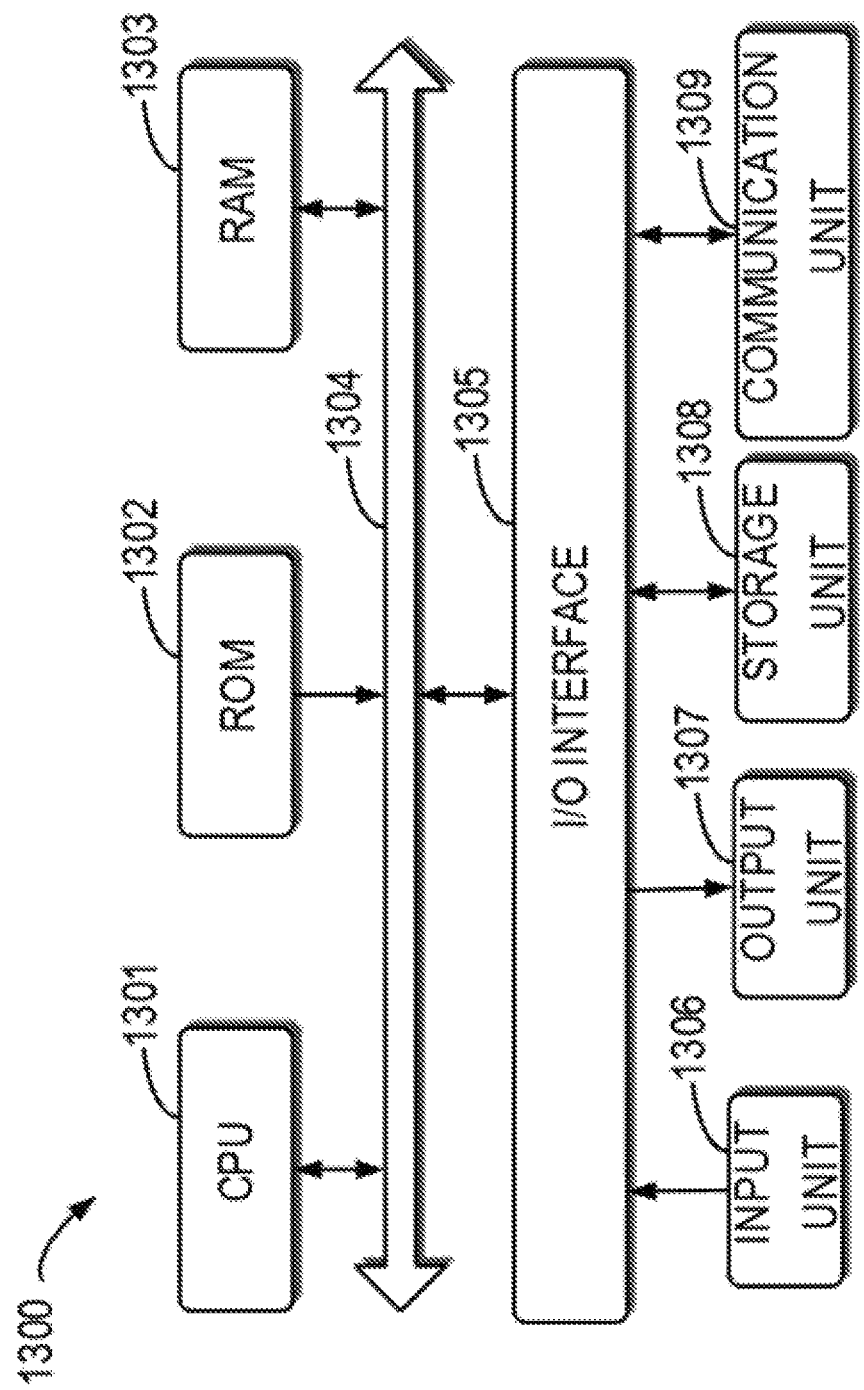
FIG. 13 shows a schematic block diagram of an exemplary device 1300 which is applicable to implement the embodiments of the present disclosure.

FIG. 13 shows a schematic block diagram of an example device 1300 which is applicable to implement the embodiments of the present disclosure. As shown, the device 1300 comprises a central processing unit (CPU) 1301 which is capable of performing various appropriate actions and processes in accordance with computer program instructions stored in a read only memory (ROM) 1302 or computer program instructions loaded from a storage unit 1308 to a random access memory (RAM) 1303. In RAM 1303, there are also stored various programs and data required by device 1300 when operating. The CPU 1301, ROM 1302 and RAM 1303 are connected to one another via a bus 1304. An input/output (I/O) interface 1305 is also connected to the bus 1304.

Multiple components in the device 1300 are connected to the I/O interface 1305: an input unit 1306 including a keyboard, a mouse, or the like; an output unit 1307, such as various types of displays, a loudspeaker or the like; a storage unit 1308, such as a disk, an optical disk or the like; and a communication unit 1309, such as a LAN card, a modem, a wireless communication transceiver or the like. The communication unit 1309 allows the device 1300 to exchange information/data with other device via a computer network, such as the Internet, and/or various telecommunication networks.

The above-described procedures and processes, such as the methods 400, 600, 800, 900 and 1000, may be executed by the processing unit 1301. For example, in some embodiments, the above methods may be implemented as a computer software program, which is tangibly embodied on a machine readable medium, e.g. the storage unit 1308. In some embodiments, part or the entirety of the computer program may be loaded to and/or installed on the device 1300 via the ROM 1302 and/or the communication unit 1309. The computer program, when loaded to the RAM 1303 and executed by the CPU 1301, may execute one or more steps of the methods 400, 600, 800, 900 and 1000 as described above.

In view of the above, the exemplary embodiments of the present disclosure propose a solution for compressing metadata including IBs in a file system. By compressing and storing the above continuous or partially continuous data block addresses in IBs, the solution can reduce the number of IBs for storing data block addresses, thereby increasing memory efficiency. Specifically, with the solution for compressing metadata in a file system according to embodiments of the present disclosure, compressed metadata does not have to be de-compressed during the reading (or rewriting) of the data, such that the memory efficiency can be improved as much as possible without affecting the performance of data reading.

The present disclosure may be a method, an apparatus, a system, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method for compressing metadata in a file system, the metadata comprising a first group of indirect blocks, the method comprising:

in response to receiving a first request for writing first data to a file, wherein the first request includes a first offset indicating a start location in the file to which the first data is to be written and a first length of the first data, determining, based on the first offset and the first length, whether the first request is for an initial write to a storage area associated with a second indirect block in the first group of indirect blocks, the first group of indirect blocks at least including a first indirect block and the second indirect block, and wherein the first indirect block includes a first area for compressing continuous storage addresses, the first area including a plurality of first sub-areas, each of the plurality of first sub-areas corresponding to a same number of data blocks;

in response to the initial write, allocating a first group of data blocks for writing the first data on a storage device;

compressing the first group of indirect blocks by encoding a first group of storage addresses corresponding to the first group of data blocks into the first indirect block, wherein compressing the first group of indirect blocks causes the first indirect block to store encodings of storage addresses corresponding to data blocks on the storage device that are allocated for writing data to storage areas of the file associated with multiple ones of the indirect blocks in the first group of indirect blocks; and wherein encoding the first group of storage addresses includes:
  determining, based on the first offset and the first length, at least one first sub-area associated with the first group of data blocks, the at least one first sub-area being included in the plurality of first sub-areas in the first indirect block, wherein the at least one first sub-area includes a first field indicating a storage address of a starting data block in the same number of data blocks and a first bitmap indicating whether a respective storage address of each of the same number of data blocks is valid, encoding the first group of storage addresses into the at least one first sub-area,
  determining, based on the second indirect block, the first indirect block in the first group of indirect blocks, updating the first field based on the first group of storage addresses, and in response to determining that part of the first group of storage addresses are discontinuous, setting at least one bit corresponding to the part of the first group of storage addresses in the first bitmap to be invalid.

2. The method of claim 1, wherein determining whether the first request is for an initial write to a storage area associated with a second indirect block further comprises:
  determining, based on the first offset and the first length, a first intermediate indirect block associated with the first data, the first intermediate indirect block recording at least one address of the first group of indirect blocks;
  determining, based on the first offset and the first length, that the first data is to be written to the storage area associated with the second indirect block; and
  in response to determining that an address of the second indirect block as recorded in the first intermediate indirect block is invalid, determining that the first request is for the initial write to the storage area.

3. The method of claim 1, wherein the first indirect block further includes a second area for recording discontinuous storage addresses, and encoding the first group of storage addresses further comprises:
  recording the part of the first group of storage addresses in the second area.

4. The method of claim 2, further comprising:
  after performing the initial write, updating, in the first intermediate indirect block, the address of the second indirect block with an address of the first indirect block such that the second indirect block points to the first indirect block.

5. The method of claim 1, further comprising:
  in response to determining that space occupied in the first indirect block exceeds a predefined threshold, dividing the first group of indirect blocks into at least two groups of indirect blocks, the at least two groups of indirect blocks including a second group of indirect blocks and a third group of indirect blocks, the second group of indirect blocks including the first indirect block and the third group of indirect blocks at least including a third indirect block; and
  encoding a storage address as encoded in the first indirect block into the third indirect block, the storage address being associated with one of the third group of indirect blocks.

6. The method of claim 5, further comprising:
  in response to receiving a second request for reading second data from a file, determining whether the second data is to be read from a storage area associated with a fifth indirect block in a fourth group of indirect blocks at least including a fourth indirect block and the fifth indirect block; and
  in response to determining that the second data is to be read from the storage area, determining from the fourth indirect block a second group of storage addresses of a second group of data blocks for storing the second data.

7. The method of claim 6, wherein the second request includes a second offset indicating a start location in the file to which the second data is written, and a second length of the second data, and the determining whether the second data is to be read from a storage area associated with a fifth indirect block comprises:
  determining, based on the second offset and the second length, a second intermediate indirect block associated with the second data, the second intermediate indirect block recording at least one address of the fourth group of indirect blocks; and
  determining, based on the second offset and the second length, that the second data is to be read from the storage area associated with the fifth indirect block.

8. The method of claim 6, wherein the determining a second group of storage addresses comprises:
  determining, based on the fifth indirect block, the fourth indirect block in the fourth group of indirect blocks.

9. The method of claim 7, wherein the fourth indirect block includes a third area for compressing continuous storage addresses, the third area including a plurality of third sub-areas, each of the plurality of third sub-areas corresponding to a same number of data blocks, and the determining a second group of storage addresses comprises:
  determining, based on the second offset and the second length, at least one third sub-area associated with the second group of data blocks, the at least one third sub-area being included in the plurality of third sub-areas; and
  determining the second group of storage addresses from the at least one third sub-area.

10. The method of claim 9, wherein the at least one third sub-area includes a second field indicating a storage address of a start data block in the same number of data blocks and a second bitmap indicating whether a respective storage address of each of the same number of data blocks is valid, and the determining the second group of storage addresses from the at least one third sub-area comprises:
  determining, based on the second field and a valid bit contained in the second bitmap, a first storage address corresponding to the valid bit in the second group of storage addresses.

11. The method of claim 10, wherein the fourth indirect block further includes a fourth area for recording discontinuous storage addresses, and the determining a second group of storage addresses comprises:
  in response to an invalid bit existing in the second bitmap, determining from the fourth area a second storage address corresponding to the invalid bit in the second group of storage addresses.

12. A device for compressing metadata in a file system, the metadata comprising a first group of indirect blocks, the device comprising:
  at least one processing unit;
  at least one memory coupled to the at least one processing unit and storing instructions to be executed by the at least one processing unit, the instructions, when executed by the at least one processing unit, causing the device to:

in response to receiving a first request for writing first data to a file, wherein the first request includes a first offset indicating a start location in the file to which the first data is to be written and a first length of the first data, determine, based on the first offset and the first length, whether the first request is for an initial write to a storage area associated with a second indirect block in the first group of indirect blocks, the first group of indirect blocks at least including a first indirect block and the second indirect block, and wherein the first indirect block includes a first area for compressing continuous storage addresses, the first area including a plurality of first sub-areas, each of the plurality of first sub-areas corresponding to a same number of data blocks;

in response to determining that the first request is for the initial write to the storage area, allocate a first group of data blocks for writing the first data on a storage device;

compress the first group of indirect blocks by encoding a first group of storage addresses corresponding to the first group of data blocks into the first indirect block, wherein the first group of indirect blocks is compressed by causing the first indirect block to store encodings of storage addresses corresponding to data blocks on the storage device that are allocated for writing data to storage areas of the file associated with multiple ones of the indirect blocks in the first group of indirect blocks;

and wherein the program code when executed by the at least one processing unit causes the device to encode the first group of storage addresses at least in part by causing the device to:

determine, based on the first offset and the first length, at least one first sub-area associated with the first group of data blocks, the at least one first sub-area being included in the plurality of first sub-areas in the first indirect block, wherein the at least one first sub-area includes a first field indicating a storage address of a starting data block in the same number of data blocks and a first bitmap indicating whether a respective storage address of each of the same number of data blocks is valid, encode the first group of storage addresses into the at least one first sub-area determine, based on the second indirect block, the first indirect block in the first group of indirect blocks, update the first field based on the first group of storage addresses, and in response to a determination that part of the first group of storage addresses are discontinuous, set at least one bit corresponding to the part of the first group of storage addresses in the first bitmap to be invalid.

13. The device of claim 12, wherein determining whether the first request is for an initial write to a storage area associated with a second indirect block further comprises:
  determining, based on the first offset and the first length, a first intermediate indirect block associated with the first data, the first intermediate indirect block recording at least one address of the first group of indirect blocks;
  determining, based on the first offset and the first length, that the first data is to be written to the storage area associated with the second indirect block; and
  in response to determining that an address of the second indirect block as recorded in the first intermediate indirect block is invalid, determining that the first request is for the initial write to the storage area.

14. The device of claim 12, wherein the first indirect block further comprises a second area for recording discontinuous storage addresses, and encoding the first group of storage addresses further comprises:
  recording the part of the first group of storage addresses in the second area.

* * * * *